United States Patent [19]

Evans

[11] Patent Number: 5,543,170
[45] Date of Patent: Aug. 6, 1996

[54] DESORPTION MASS SPECTROMETRIC CONTROL OF ALLOY COMPOSITION DURING MOLECULAR BEAM EPITAXY

[75] Inventor: Keith R. Evans, Jamestown, Ohio

[73] Assignee: The United States of America as represented by the Secretary of the Air Force, Washington, D.C.

[21] Appl. No.: 376,131

[22] Filed: Jan. 19, 1995

Related U.S. Application Data

[63] Continuation of Ser. No. 133,375, Aug. 26, 1993, abandoned.

[51] Int. Cl.$^6$ .................................................. B05D 1/12
[52] U.S. Cl. ............................. 427/8; 427/446; 427/452; 427/456; 427/566; 427/255.1; 427/255.2
[58] Field of Search ................................. 427/8, 446, 452, 427/455, 462, 463, 464, 566, 255.1, 255.2; 156/620.2, 620.5

[56] References Cited

U.S. PATENT DOCUMENTS

| | | | |
|---|---|---|---|
| 4,332,833 | 6/1982 | Aspnes et al. | 427/8 |
| 4,575,462 | 5/1986 | Dobson et al. | 427/9 |
| 4,812,650 | 5/1989 | Eckstein et al. | 250/307 |
| 4,835,383 | 5/1989 | Mahoney et al. | 250/281 |
| 4,896,035 | 6/1990 | Mahoney et al. | 250/309 |
| 4,931,132 | 6/1990 | Aspnes et al. | 156/601 |
| 4,988,879 | 1/1991 | Zare et al. | 250/423 P |
| 5,018,479 | 5/1991 | Markunas et al. | 118/723 |
| 5,091,320 | 2/1992 | Apnes et al. | 437/8 |
| 5,097,125 | 3/1992 | Gruen et al. | 250/305 |
| 5,164,359 | 11/1992 | Calviello et al. | 505/1 |
| 5,171,399 | 12/1992 | Brennan et al. | 156/601 |
| 5,206,706 | 4/1993 | Quinn | 356/400 |
| 5,339,521 | 3/1995 | Celli et al. | 437/105 |
| 5,400,739 | 3/1995 | Kao et al. | 437/105 |

OTHER PUBLICATIONS

"Cation Incorporation Rate Limitations in Molecular-beam Epitaxy: Effects of Strain and Surface Composition", Evans et al, J Vac Sci Tech B7(2):259, Mar./Apr. 1989.

"Mass Spectrometric Determination of Antimony Incorporation During III-V Molecular Beam Epitaxy", Evans et al, J Vac Tech B8(2) Mar./Apr. 1990.

"Incorporation/Desorption Rat Variation at Heterointerfaces in III-V Molecular Beam Epitaxy", Evans et al, J. Vac Sci Tech B9(4):2427 Jul./Aug. 1991.

"Growth of $Al_xGa_{1-x}$ As Parabolic Quantum Wells by Real--time Feedback Control of Composition", Aspnes et al, Appl Phys Lett 60(10)a Mar. 1992.

"Desorption Mass Spectrometric Control of Composition During MBE Growth of AlGaAs", Evans et al, J Crys Growth 127:523–527 (1993).

"Arbitrary Composition Profiles by MBE Using Desorption Mass Spectrometry", Evans et al, Proc Spring 1993 Meeting.

"Molecular-beam epitaxy flux transient monitoring and correction using in situ reflection mass spectrometry", by F. G. Celii et al, J. Vac. Sci. Tech. B11(3), 1018 (May/Jun. 1993).

(List continued on next page.)

Primary Examiner—Shrive Beck
Assistant Examiner—Brian K. Talbot
Attorney, Agent, or Firm—Bobby D. Scearce; Thomas L. Kundert

[57] ABSTRACT

System and method for controlling alloy composition during molecular beam epitaxy growth of group III-V ternaries at high substrate temperature or under any conditions which give rise to significant desorption rates is described which incorporates desorption mass spectrometry in a real time feedback loop for continuous monitoring and control of layer composition by control of incident group V (e.g., arsenic) flux.

12 Claims, 2 Drawing Sheets

OTHER PUBLICATIONS

"Detection and reduction of indium segregation during molecular-beam epitaxial growth of InGaAs/GaAs using *in situ* reflection mass spectrometry", by Y. C. Kao et al, J. Vac. Sci. Tech. B11(3), 1023 (May/Jun. 1993).

"Real-time thickness control of resonant-tunneling diode growth based on reflection mass spectrometry", by F. G. Celii et al, Appl. Phys. Lett. 66(19), 2555 (8 May 1995).

Mass Spectrometry During Molecular-beam Epitaxy: An Alternative Reflection High-Energy Diffraction, Springthorpe et al., J. Vacuum Science & Technology B, vol. 6, No. 2, Mar./Apr. 1988, pp. 754–757.

Reflection Mass Spectrometry of As Incorporation During GaAs Molecular Beam Epitaxy, Tsao et al., Applied Physics Letters vol. 53, No. 4, Jul. 25, 1988, pp. 257–259.

Surface Stoichiometry Dependence of $As_2$ Desorption and $As_4$ Reflection from GaAs(001), Tsao et al, J. Vacuum Science Technology A, vol. 7, No. 3, part II, May/Jun. 1989, pp. 2138–2142.

On-Line Determination of Alloy Composition During Ternary III/V Molecular Beam Epitaxy, Tsao et al, Applied Physics Letters, vol. 55 No. 8, Aug. 21, 1989, pp. 777–779.

Application of Reflection Mass Spectrometry to Molecular Beam Epitaxial Growth of InAlAs or InGaAs, J. Vacuum Science & Technology B, vol. 7, No. 2, Mar./Apr. 1989, pp. 277–282.

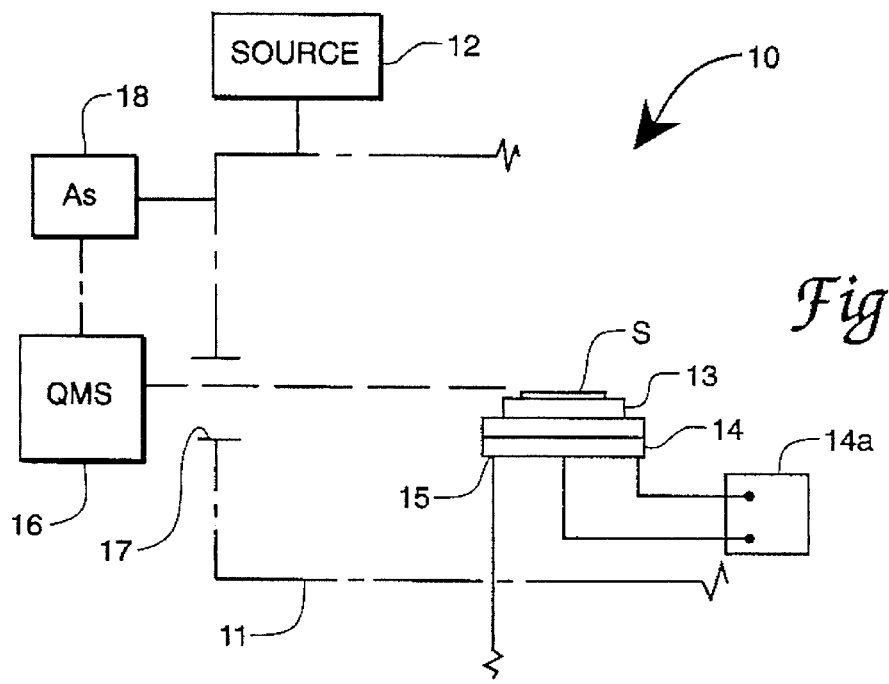
*Fig. 1*
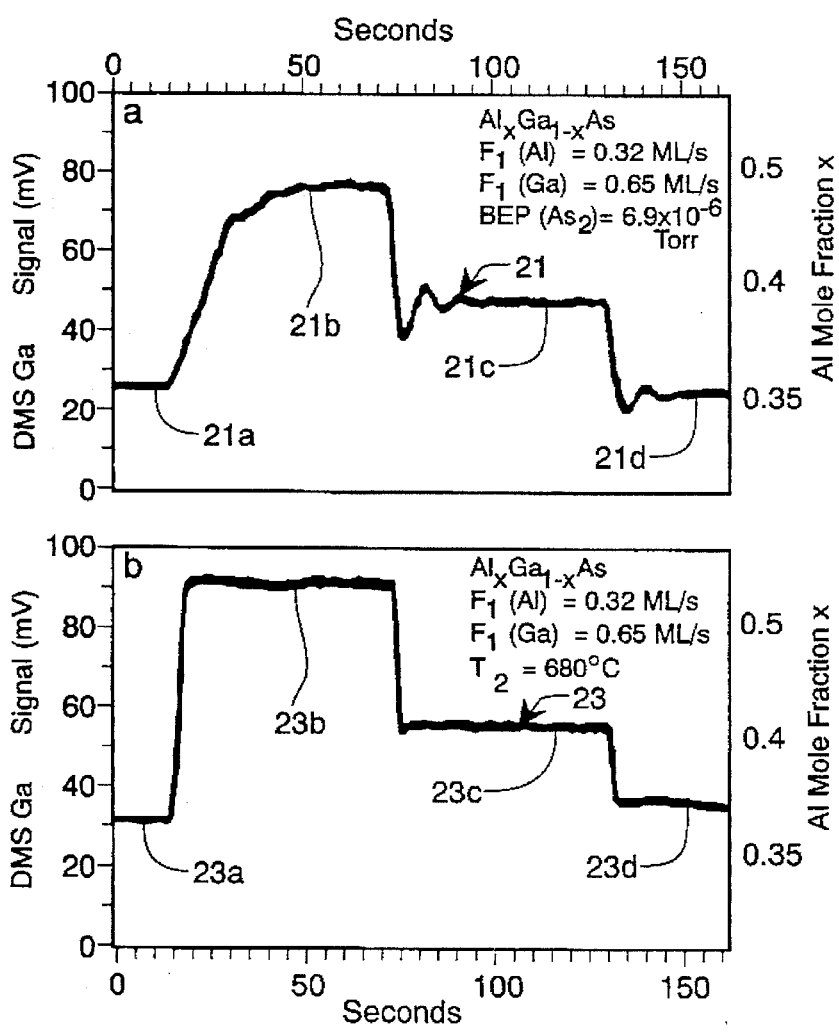
*Fig. 2a*
*Fig. 2b*

DESORPTION MASS SPECTROMETRIC CONTROL OF ALLOY COMPOSITION DURING MOLECULAR BEAM EPITAXY

The invention described herein may be manufactured and used by or for the Government of the United States for all governmental purposes without the payment of any royalty.

CROSS REFERENCE TO RELATED APPLICATION

This application is a continuation of application Ser. No. 08/113,375, filed on Aug. 26, 1993, now abandoned.

This application is related to application Ser. No. 08/113,374 filed Aug. 26, 1993, commonly assigned, now abandoned, entitled "Desorption Mass Spectrometric Control of Substrate Temperature During Molecular Beam Epitaxy."

BACKGROUND OF THE INVENTION

The present invention relates generally to systems and methods for controlling growth of crystals or thin films, and more particularly to system and method for controlling alloy composition during molecular beam epitaxy.

Molecular beam epitaxy (MBE) grown group III-V ternaries are known to suffer from problems associated with deep compensating centers, non-radiative traps, surface/interface imperfections, and alloy clustering. Although some evidence shows that growth at high substrate temperature can improve optical and electrical properties of such layers, high temperature growth is often avoided because of desorption effects which reduce composition and thickness control.

The invention utilizes desorption mass spectrometry (DMS) for control of alloy composition during MBE growth of group III-V structures under conditions for which desorption is significant enough to appreciably affect epitaxial layer composition. The invention may be generally applicable to any high or ultra-high vacuum deposition method, although successful demonstration of the invention was performed in an MBE growth chamber. A mass spectrometer (MS) is positioned on the center port or one of the oven ports of the source flange of a conventional MBE chamber for continuous monitoring of the desorbed fluxes of the non-incorporated fraction of incident species. Growth rate and layer composition are determined from incorporation-rates, and incorporation rates are given by the difference between incident flux and desorbed flux; the composition of the growing layer is then exactly deduced from the measured desorption rates when the MS is calibrated and the incident fluxes are known. The MS is calibrated by monitoring its signal when none of a given incident species is incorporated, i.e., under conditions for which the incident flux equals the desorbed flux. The measured desorbed flux is compared with its desired value (as by computer based control), and an appropriate error signal is generated and converted into a new setpoint for one or more growth parameters. Arbitrarily graded structures may be produced by programming the appropriate desorbed flux versus time profile.

It is a principal object of the invention to provide system and method for control of alloy composition during MBE.

It is another object of the invention to provide system and method for controlling alloy composition during MBE of layer compositions comprising group III-V elements.

These and other objects of the invention will become apparent as a detailed description of representative embodiments proceeds.

SUMMARY OF THE INVENTION

In accordance with the foregoing principles and objects of the invention, system and method for controlling alloy composition during molecular beam epitaxy growth of group III-V ternaries at high substrate temperature or under any conditions which give rise to significant desorption rates is described which incorporates desorption mass spectrometry in a real time feedback loop for continuous monitoring and control of layer composition by control of incident group V (e.g., arsenic) flux.

DESCRIPTION OF THE DRAWINGS

The invention will be more clearly understood from the following detailed description of representative embodiments thereof read in conjunction with the accompanying drawings wherein:

FIG. 1 is a schematic of a representative system suitable for practicing the method of the invention;

FIG. 2A and 2B are plots of Ga desorption rate versus time at selected substrate temperatures and incident arsenic fluxes;

DETAILED DESCRIPTION

Figure 3:
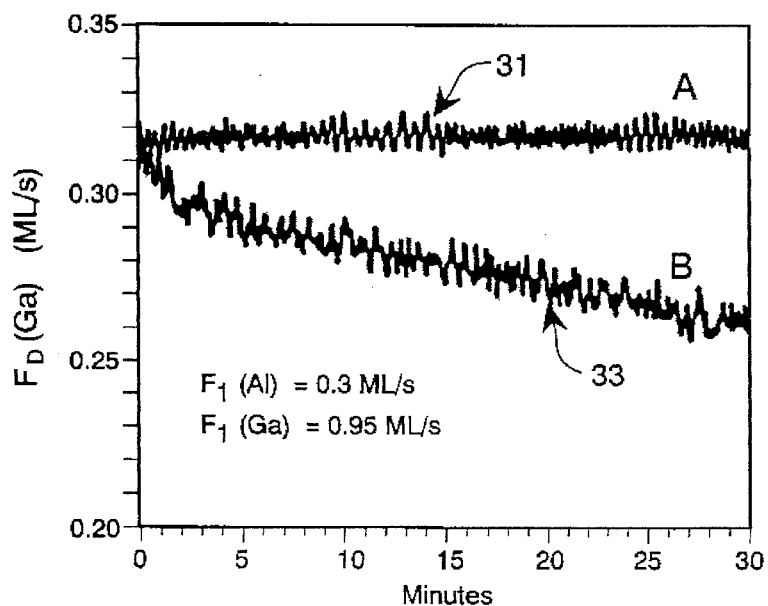
FIG. 3 shows Ga desorption rate versus time during AlGaAs growth nominally at 720° C. using DMS control and thermocouple control of substrate temperature.

Theoretical considerations and experimental procedures for mass spectrometric control of layer composition during MBE growth of compounds of interest herein are described in (1) Evans et al, "Desorption Mass Spectrometric Control of Composition During MBE Growth of AlGaAs" Journal of Crystal Growth 127:523–527 (1993), and (2) Evans et al, "Arbitrary Composition Profiles by MBE Using Desorption Mass Spectrometry" Proc Spring 1993 MRS Meeting, 300:495 (1993), the entire teachings of which are incorporated herein by reference.

In general, for the growth of group III-V alloys (such as $Al_xGa_{1-x}As$, $Al_xGa_{1-x}N$, $In_xGa_{1-x}As$, $Al_xIn_{1-x}As$, $Al_xGa_yIn_{1-x-y}As$, $GaAs_xSb_{1-x}$, $GaAs_xP_{1-x}$), the desorption rate of one or more growth species and thus the Composition of the film is affected by both substrate temperature $T_s$ and incident flux $F_i$ of the group V species, viz., $F_i(N)$, $F_i(As)$, $F_i(P)$, $F_i(Sb)$. In accordance then with a principal feature of the invention, either $T_s$ or $F_i$ may be incorporated into the feedback loop; i.e., $T_s$ or $F_i$ is varied in order to obtain the desired desorbed flux and composition. $T_s$ affects desorbed fluxes because the desorption process has an activation energy associated with it, thus increasing $T_s$ increases the ability of the atom or molecule to overcome that activation energy and desorb. In cases where more than one group V species is present, e.g., GaAsSb, the relative activation energies for both group V species (As and Sb) desorption must be considered. The reason that $F_i$ affects the desorption rate of a particular growth species can be understood by consideration of the law of mass action, which provides that in a chemical reaction the relative concentrations of reactants and products will adjust themselves, when the concentration of one of the reactants or products is changed, in a way which maintains the appropriate equilibrium constant. This law is loosely applicable to MBE since MBE growth is not an equilibrium process, but provides accurate qualitative predictions. Therefore, in the $GaAs_xP_{1-x}$ system, increasing $F_i$ for incident phosphorus flux will decrease the x-value. Considering that the activation energy for P desorption is lower than for As desorption, increasing $T_s$ will also increase the x-value.

Referring now to the drawings, FIG. 1 shows a schematic of a representative system 10 for practicing the method of the invention. A vacuum deposition chamber 11 (shown by peripheral broken line) is provided for deposition of layer S of the materials of interest from source 12 onto substrate 13 of a suitable material. As suggested herein, source 12 may include generally the elements for depositing layer S comprising any group III-V ternary, those elements of particular interest being boron, aluminum, gallium, indium, nitrogen, phosphorus, arsenic and antimony, selected by one skilled in the art practicing the invention.

Depositions made in demonstration of the invention used a substrate 13 of (001) GaAs (two inch diameter) indium soldered to a molybdenum block. Temperature controllable substrate heater 14 was used to heat substrate 13; temperatures were measured using thermocouple 15. Although any suitable high or ultrahigh vacuum deposition method may be used in the practice of the invention, the depositions in demonstration of the invention were performed in a chamber 11 comprising a commercial solid source MBE chamber (Varian 360, Intevac). MBE chamber 11 was modified by placing quadruple mass spectrometer (QMS) 16 (Extrel C50, Extrel/Millipore) on the center port of source flange 17 of chamber 11 for desorption monitoring. QMS 16 was positioned with line-of-sight view of substrate 13 and was contained in a differentially pumped and shuttered housing with four beam skimmers (not shown) to minimize background signals. Desorption rates were determined quantitatively using calibration procedures for QMS 16. A high capacity, valved, arsenic cracker cell was used as a source 18 which allowed rapid selection and control of the incident arsenic flux $F_i(As)$.

In demonstration of the invention, $Al_xGa_{1-x}As$ and $GaAs_xSb_{1-x}$ structures were grown using $T_s$ and $F_i(As)$ as growth parameters in the feedback loop. Increasing $T_s$ or decreasing $F_i(As)$ leads to increased Ga (group III) desorption ($F_d(Ga)$) during $Al_xGa_{1-x}As$ growth and an increased x-value. Increasing $T_s$ or increasing $F_i(As)$ leads to increased Sb desorption during $GaAs_ySb_{1-y}$ growth and thus an increased y-value. The measured value of $F_d(Ga)$ is compared with the desired value determined from the desired Al fraction according to the teachings of Evans et al (1), and the resulting error signal is minimized by appropriately varying $T_s$ and $F_i(As)$.

Referring now to FIG. 2A and 2B, shown therein are plots of Ga desorption rate versus time obtained by varying $T_s$ and $F_i(As)$. The sensitivity and time response of $F_d(Ga)$ to stepwise changes in substrate temperature are shown in FIG. 2A by plot 21 and to stepwise changes in As valve position corresponding to the indicated beam pressure values are shown in FIG. 2B by plot 23. In the demonstration run represented by plot 21, regions 21a,b,c,d correspond to respective $T_s$ of 680°, 706°, 695° and 680° C. Regions 23a,b,c,d correspond respectively to $6.9\times10^{-6}$, $1.2\times10^{-6}$, $2\times10^{-6}$ and $6.9\times10^{-6}$ Torr. Also given are the growth conditions and corresponding Al fractions. Apparent sluggish response of $F_d(Ga)$ to $T_s$ results in part from the thermal mass of the molybdenum block. The high sensitivity of $F_d(Ga)$ to changes in $T_s$ is discussed in Evans et al (1), supra.

FIG. 3 shows variation of Ga desorption rate with time during AlGaAs growth nominally at 720° C. Sample A (plot 31) corresponds to DMS control, and sample B (plot 33) corresponds to conventional thermocouple $T_s$ control, the samples otherwise being grown under identical conditions. During conventional high $T_s$ growth of test AlGaAs structures, using a thermocouple for $T_s$ control, sample B (plot 33), $F_d(Ga)$ is observed to decrease slowly with time. The incident cation fluxes and QMS calibration did not change during the course of growth, which indicates that AlGaAs composition in sample B is vertically graded, with an Al fraction which decreases toward the surface. By decoupling the substrate thermocouple from the substrate heater controller 14a and using the value of $F_d(Ga)$ from the QMS as input to the controller, the value of $F_d(Ga)$ is held approximately constant, as indicated by plot 31 for sample A. The controller reacted to a slight increase (decrease) of $F_d(Ga)$ over (below) its setpoint by reducing (increasing) the current to the substrate heater, thereby slightly reducing (increasing) $T_s$ and bringing the value of $F_d(Ga)$ closer to its setpoint value. From FIG. 3, the predicted Al fraction for sample A is roughly constant and greater than that of sample B except during AlGaAs growth initiation.

Figure 4:
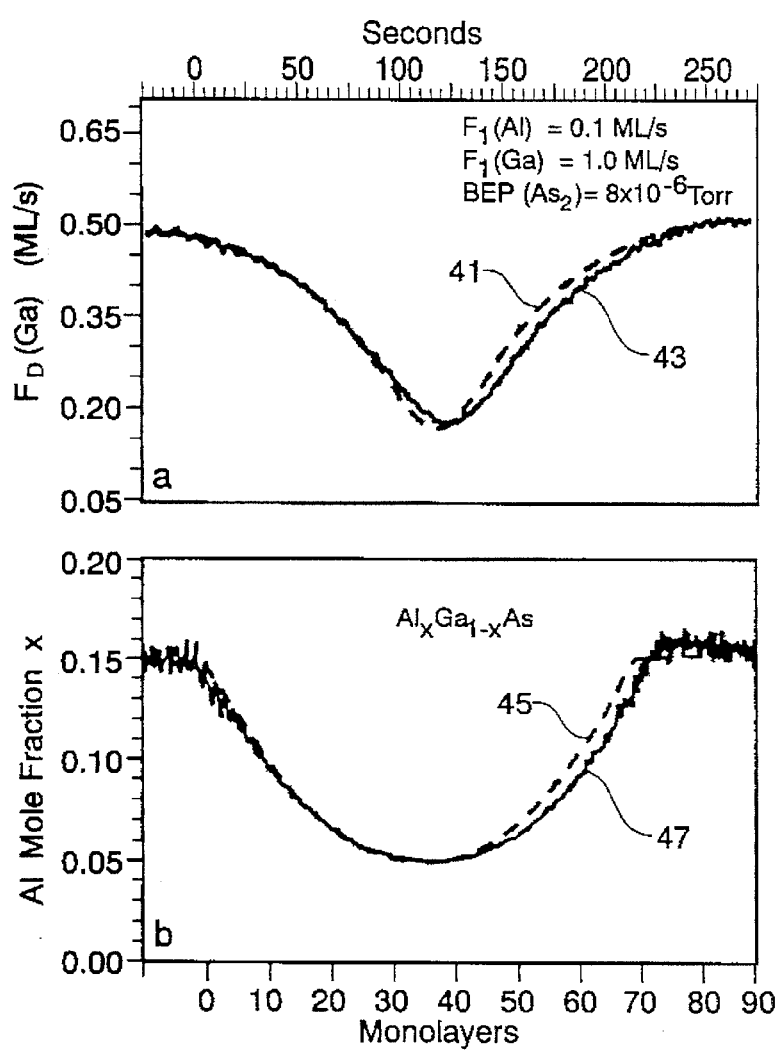
FIG. 4 shows the predicted and obtained Ga desorption rate versus time profiles and calculated and obtained Al fraction versus thickness profiles during DMS controlled growth of a parabolic AlGaAs well.

The ability to produce complex composition profiles was demonstrated by deposition of a parabolic AlGaAs quantum well using constant incident fluxes without shuttering through suitable control of $F_d(Ga)$, arsenic source 18 pressure and $T_s$. Predicted (plot 41) and obtained (plot 43) $F_d(Ga)$ versus time profiles and calculated (plot 45) and obtained (plot 47) compositional profiles are shown in FIG. 4.

The method described herein is applicable generally to all group III-V compounds. In accordance with the teachings hereof, each ternary or quaternary compound is expected to give rise to desorption rates which are dependent on both $T_s$ and group V flux, which allows the skilled MBE artisan practicing the invention to produce structures with composition of any group III-V elements. Arbitrarily graded structures may be produced by programming the appropriate desorbed flux versus time profile.

The invention therefore provides system and method for controlling alloy composition during film growth using MBE. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

I claim:

1. A method for vacuum deposition of a group III-V ternary alloy, comprising the steps of:

(a) providing sources of three elements selected from group III and group V, said sources comprising at least one group III element and at least one group V element;

(b) continuously generating from said sources incident fluxes of known intensities of said group III and group V elements for vacuum depositing a group III-V ternary alloy layer onto a substrate, and generating a desorbed flux of a said group III element from said substrate;

(c) continuously monitoring the intensifies of said incident fluxes and the intensity of the desorbed flux of a said group III element;

(d) comparing the intensities of said incident flux and said desorbed flux of said group III element and determining the amount of said group III element incorporated into said layer from the difference between the intensifies of said incident flux and said desorbed flux of said group III element; and (e) adjusting the intensity of the incident flux of a said group V element until said difference between the intensities of said incident flux and said desorbed flux of said group III element equals a value corresponding to the composition of said group III element in said group III-V ternary alloy.

2. The method of claim 1 wherein the step of continuously monitoring the intensities of said incident fluxes and the intensity of the desorbed flux of a group III element is performed using a mass spectrometer.

3. The method of claim 1 wherein said source comprises at least three elements from the group consisting of boron, aluminum, gallium, indium, nitrogen, phosphorus, arsenic and antimony.

4. A method for vacuum deposition of a group III-V ternary alloy, comprising the steps of:

(a) providing sources of three elements selected from group III and group V, said sources comprising at least one group III element and at least one group V element;

(b) continuously generating from said sources incident fluxes of known intensifies of said group III and group V elements for vacuum depositing a group III-V ternary alloy layer onto a substrate, and generating a desorbed flux of a said group III element from said substrate;

(c) continuously monitoring the intensifies of said incident fluxes and the intensity of the desorbed flux of a said group III element;

(d) comparing the intensities of said incident flux and said desorbed flux of said group III element and determining the amount of said group III element incorporated into said layer from the difference between the intensities of said incident flux and said desorbed flux of said group III element; and (e) adjusting the temperature of said substrate until said difference between the intensifies of said incident flux and said desorbed flux of said group III element equals a value corresponding to the composition of said group III element in said group III-V ternary alloy.

5. The method of claim 4 wherein the step of continuously monitoring the intensities of said incident fluxes and the intensity of the desorbed flux of a group III element is performed using a mass spectrometer.

6. The method of claim 4 wherein said source comprises at least three elements from the group consisting of boron, aluminum, gallium, indium, nitrogen, phosphorus, arsenic and antimony.

7. A method for vacuum depositing a Group III-V alloy, comprising the steps of:

(a) providing sources of at least three elements selected from the Group III and Group V, said sources comprising at least one Group III element and one Group V element;

(b) continuously generating from said sources incident fluxes of known intensities of said Group III and Group V elements for vacuum depositing a Group III-V alloy layer onto a heated substrate, and generating a desorbed flux of one said Group III element from said heated substrate;

(c) continuously measuring the intensity of the desorbed flux of a said Group III element;

(d) comparing the intensities of said incident flux and said desorbed flux of said Group III element and determining the amount of said Group III element incorporated into said layer from the difference between the intensities of said incident flux and said desorbed flux of said Group III element; and (e) continuously adjusting heat to said heated substrate in response to the determination of said difference whereby said difference between the intensities of said incident flux and said desorbed flux of said Group III element is maintained at a value corresponding to a preselected temperature of said substrate.

8. The method of claim 7, wherein the step of continuously measuring the intensity of the desorbed flux of a group III element is performed using a mass spectrometer.

9. The method of claim 7, wherein said sources comprise at least three elements selected from the group consisting of boron, aluminum, gallium, indium, nitrogen, phosphorus, arsenic and antimony.

10. The method of claim 1, including means for continuously measuring the intensities of said incident fluxes.

11. The method of claim 4, including means for continuously measuring the intensities of said incident fluxes.

12. The method of claim 7, including means for continuously measuring the intensities of said incident fluxes.

* * * * *